United States Patent
Yeo et al.

(10) Patent No.: US 8,030,140 B2
(45) Date of Patent: Oct. 4, 2011

(54) SEMICONDUCTOR DEVICE HAVING A GERMANIUM LAYER AS A CHANNEL AND METHOD FOR MANUFACTURING THE SAME

(75) Inventors: Tae Yeon Yeo, Seoul (KR); Chi Hwan Jang, Icheon-si (KR)

(73) Assignee: Hynix Semiconductor Inc, Icheon-Si (KR)

( * ) Notice: Subject to any disclaimer, the term of this patent is extended or adjusted under 35 U.S.C. 154(b) by 0 days.

(21) Appl. No.: 12/648,181

(22) Filed: Dec. 28, 2009

(65) Prior Publication Data

US 2010/0197084 A1 Aug. 5, 2010

(30) Foreign Application Priority Data

Feb. 4, 2009 (KR) .................. 10-2009-0008930

(51) Int. Cl.
*H01L 21/00* (2006.01)
*H01L 21/336* (2006.01)
*H01L 21/20* (2006.01)
*H01L 21/3205* (2006.01)

(52) U.S. Cl. ......... 438/151; 438/197; 438/479; 438/585
(58) Field of Classification Search .................. None
See application file for complete search history.

(56) References Cited

U.S. PATENT DOCUMENTS

| | | | | |
|---|---|---|---|---|
| 5,998,807 | A * | 12/1999 | Lustig et al. | 257/66 |
| 7,005,676 | B2 * | 2/2006 | Tezuka et al. | 257/65 |
| 7,217,603 | B2 * | 5/2007 | Currie et al. | 438/149 |
| 7,494,852 | B2 * | 2/2009 | Bedell et al. | 438/149 |
| 2006/0194418 | A1 * | 8/2006 | Lee et al. | 438/479 |
| 2006/0267017 | A1 * | 11/2006 | Noguchi et al. | 257/66 |
| 2007/0166947 | A1 * | 7/2007 | Gadkaree et al. | 438/404 |
| 2007/0170536 | A1 * | 7/2007 | Hsu et al. | 257/458 |
| 2008/0050887 | A1 * | 2/2008 | Chen et al. | 438/455 |

* cited by examiner

*Primary Examiner* — Scott B Geyer

(57) ABSTRACT

A method for manufacturing a semiconductor device comprises forming an insulating layer on a polymer substrate, growing a germanium layer on the insulating layer, forming a gate pattern on the germanium layer, forming a metal layer on the germanium layer including the gate pattern, annealing the metal layer to form a compound layer mixed with the metal layer and the germanium layer, and forming a contact by etching the metal layer.

12 Claims, 3 Drawing Sheets

US 8,030,140 B2

SEMICONDUCTOR DEVICE HAVING A GERMANIUM LAYER AS A CHANNEL AND METHOD FOR MANUFACTURING THE SAME

CROSS-REFERENCES TO RELATED APPLICATION

Priority to Korean patent application number 10-2009-0008930, filed on Feb. 4, 2009, which is incorporated by reference in its entirety, is claimed.

BACKGROUND OF THE INVENTION

The present invention relates to a semiconductor device and, more particularly, to a semiconductor device having a germanium layer as a channel and a method for manufacturing the same.

As integrity of semiconductor devices is increased, an FET (Field Effect Transistor) where a bulk silicon is used as a body, is scaled down such that the short channel effect and leakage current are occurring in the bulk Si FET.

So as to solve the problems, a method for manufacturing a semiconductor device where a transistor is embedded in the SOI substrate has been suggested. In the SOI transistor, a floating body effect can occur. The SOI substrate has a structure where an insulating layer is interposed between a semiconductor substrate and a silicon layer such that the SOI substrate itself has a capacitor structure. If charges are repeatedly moved through the transistor body, the charges can accumulate in the capacitor through a generation and recombination process of carriers due to an applied bias. The accumulated charges can seriously affect the operation of the semiconductor device. This is because the threshold voltage is changed due to the charges accumulated in the capacitor and the heat (i.e., temperature increase) generated through the repetitive charge and discharge process in the capacitor. Depending on the electric field concentration, the leakage current consistently occurs.

In the above manufacturing method, so as to reduce the leakage current such as Drain-Induced Barrier Lowering (DIBL) due to the short effective channel and the body effect, a recess gate has been developed using the trench technology in MOSFETs of the semiconductor devices. However, as the effective channel is further shortened, the recess method using a trench process arrives at a limit. In particular, in the prior Si substrate, the leakage current is increased due to reduction in the effective channel, the low power driving becomes difficult, and the manufacturing cost is high.

BRIEF SUMMARY OF THE INVENTION

According to one aspect of an example embodiment, a method for fabricating a semiconductor device includes forming an insulating layer on a polymer substrate, growing a germanium layer on the insulating layer, and forming a semiconductor device pattern by using a channel as the germanium layer.

Preferably, the germanium layer may be grown by a thickness of 1 nm through 100 nm at a temperature of 200° C. through 600° C.

Preferably, the germanium layer may be formed by a chemical vapor deposition (CVD) method or a low pressure chemical vapor deposition (LPCVD) method with mixture of any gas selected from the group consisting of B, P, As or $BF_3$ which is for a doping source and any gas selected from the group consisting of $GeH_4$, $Ge_2H_6$ or $Ge_3H_8$.

Preferably, the germanium layer may be formed by ion implanting any gas selected from the group consisting of B, P, As or $BF_3$ which is for a doping source and by carrying out a heat treatment at a temperature of 100° C. through 600° C.

Preferably, the forming a semiconductor device pattern may include forming a gate pattern on the germanium layer.

Preferably, the forming a gate pattern may include forming an oxide layer, a gate electrode and a hard mask layer on the germanium layer and etching the hard mask layer, the gate electrode and the oxide layer by using a gate pattern mask.

Preferably, the method may further include forming spacers on side walls of the gate pattern.

Preferably, after the forming a gate pattern, the method may further include forming a metal layer on the whole surface of the semiconductor substrate including the gate pattern, annealing the metal layer to form a compound layer mixed with the metal layer and the germanium layer, and forming a contact by etching the metal layer.

Preferably, the oxide layer may be formed by using any one selected from the group consisting of Hf, Zr, Ta, Co or a combination thereof.

Preferably, the metal layer may be formed by using any one selected from the group consisting of Co, Ni, W or a combination thereof.

Preferably, the forming a contact by etching the metal layer may include etching the metal layer by using a chemical mechanical polishing (CMP) process or an etchback process.

Preferably, the method may further include forming an adhesion layer between the polymer substrate and the insulating layer.

Preferably, the method may further include forming a second insulating layer on a bottom surface of the polymer substrate.

These and other features, aspects, and embodiments are described below in the section entitled "DESCRIPTION OF SPECIFIC EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF SPECIFIC EMBODIMENTS

Figure 1A:
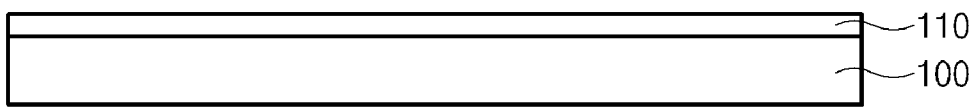
FIGS. 1a through 1h are sectional views illustrating a method for manufacturing a semiconductor device according to an embodiment of the present invention.

Hereinafter, embodiments of the present invention will now be described more fully with reference to the accompanying drawings. The embodiments may, however, be embodied in many different forms and should not be construed as being limited to the instances set forth herein. Rather, the embodiments herein are merely provided to help convey various concepts to those of ordinary skill in the art. In the drawings, the size of each element may have been exaggerated for clarity. Like reference numerals denote like elements throughout.

FIGS. 1a through 1h are sectional views illustrating a method for manufacturing a semiconductor device according to an embodiment of the present invention.

Figure 1B:
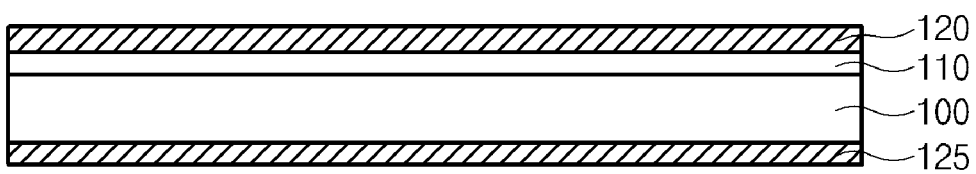

Referring to FIGS. 1a and 1b, an adhesion layer 110 and an insulating layer 120 are sequentially deposited on a polymer substrate 100. Herein, the polymer substrate 100 has excellent stability, for example it's material properties do not changed at a temperature of 500° C. or more and has a high electrical insulation characteristic at a temperature of 20° C. that suppresses the leakage current through the substrate. The adhesion layer 110 improves the adhesion between the polymer substrate 100 and the insulating layer 120. The insulating layer 120 prevents the leakage current. Another insulating layer 125 may be formed on a bottom surface of the polymer substrate 100.

Figure 1C:
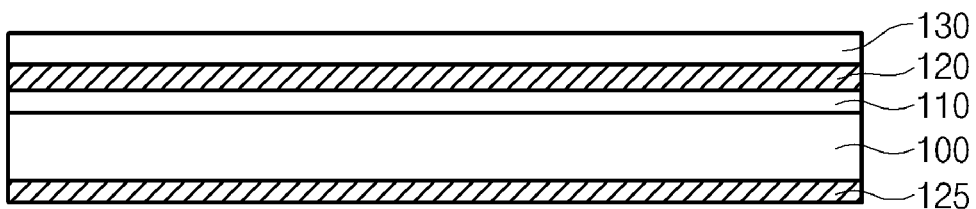
Figure 1D:
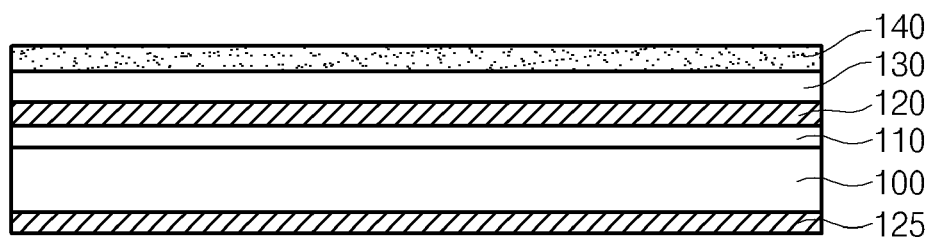

Referring to FIGS. 1c and 1d, a germanium layer 130 is formed on the insulating layer 120. Besides the germanium layer 130, a silicon layer or a carbon nano tube layer may be formed on the insulating layer 120. The germanium layer 130 is used as a channel. The germanium layer 130 has a lower band gap of 0.4 eV than the conventional silicon layer of 1.1 eV such that it can operate at lower voltages and improve the operation speed. The germanium layer 130 may be grown to a thickness of 1 nm through 100 nm at a temperature of 200 through 600° C. At this time, the germanium layer 130 may be grown by a CVD method or a LPCVD method with a mixture of any gas selected from the group consisting of P, B, As or $BF_3$ which is for a doping source and any gas selected from the group consisting of $GeH_4$, $Ge_2H_6$ or $Ge_3H_8$. On the other hand, the germanium layer 130 for a channel may formed by growing a germanium layer with an intrinsic method, ion-implanting any gas selected from the group consisting of P, B, As or $BF_3$ which is for a doping source into the germanium layer, and annealing it at a temperature of 100° C. through 600° C.

Figure 1E:
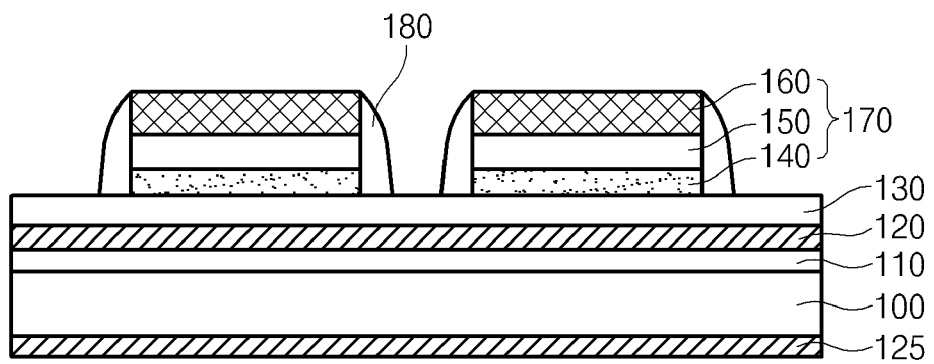

Referring to FIGS. 1d and 1e, a high dielectric oxide layer 140, a gate electrode 150 and a hard mask layer 160 are sequentially stacked on the germanium layer 130 and a photosensitive layer (not shown) is formed on the hard mask layer 160. At this time, the high oxide dielectric layer 140 may be formed by using any one selected from the group consisting of Hf, Zr, Ta, Co, and a combination thereof. The high dielectric oxide layer 140 may be deposited by a deposition method such as an Atomic Layer Deposition (ALD) method and a CVD method or a furnace. Herein, the high dielectric oxide layer 140 serves as a conventional gate oxide layer. Furthermore, as the high dielectric oxide layer 140 has a higher dielectric ratio than the conventional gate oxide layer, the dielectric properties of the high dielectric oxide layer 140 can be better controlled by its thickness.

A photosensitive layer pattern (not shown) is formed on the hard mask layer 160 through an exposure and development process using a gate pattern mask (not shown) and a gate pattern 170 is formed by etching the hard mask layer 160, the gate electrode 150 and the high dielectric oxide layer 140 using the photosensitive layer pattern as an etch mask.

An insulating layer (not shown) for spacers is deposited on the whole surface of the germanium layer 130 including the gate pattern 170 and etched-back to form sidewall spacers 180 on the sidewalls of the gate pattern 170.

Figure 1F:
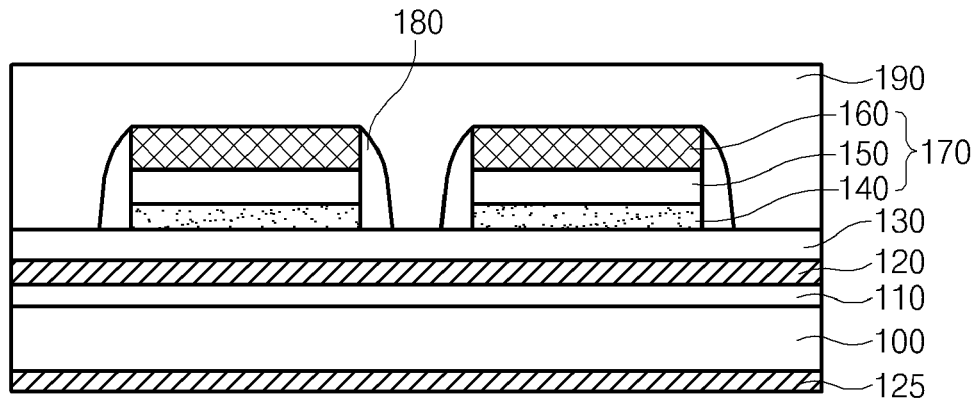

Referring to FIG. 1f, a metal layer 190 is deposited on the germanium layer 130 including the gate pattern 170. The metal layer 190 may be formed by using any one selected from the group consisting of Co, Ni, W and a combination thereof. The metal layer 190 may be formed by a Physical Vapor Deposition (PVD) method or a CVD method.

Figure 1G:
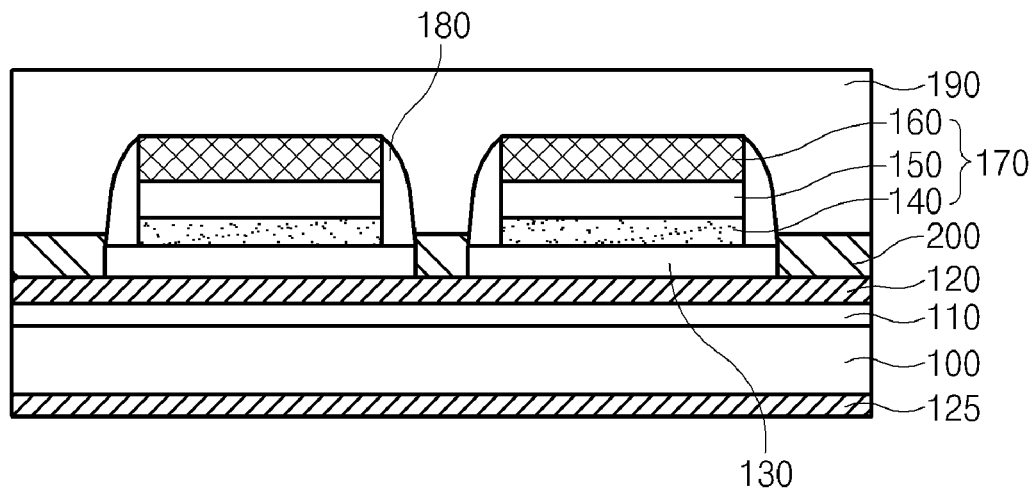

Referring to FIG. 1g, an annealing process is carried out to react the metal layer 190 with the germanium layer 130, thereby forming a compound layer 200. For example, Ni ions of the metal layer 190 react with Ge ions of the germanium layer 130 to form a nickel-germanium layer (i.e., compound layer 200). The compound layer 200 has a lower resistance then the metal silicide where the Si ions are reacted with the metallic ions, thereby improving the resistance in a contact which is to be formed in the following process and speed.

Figure 1H:
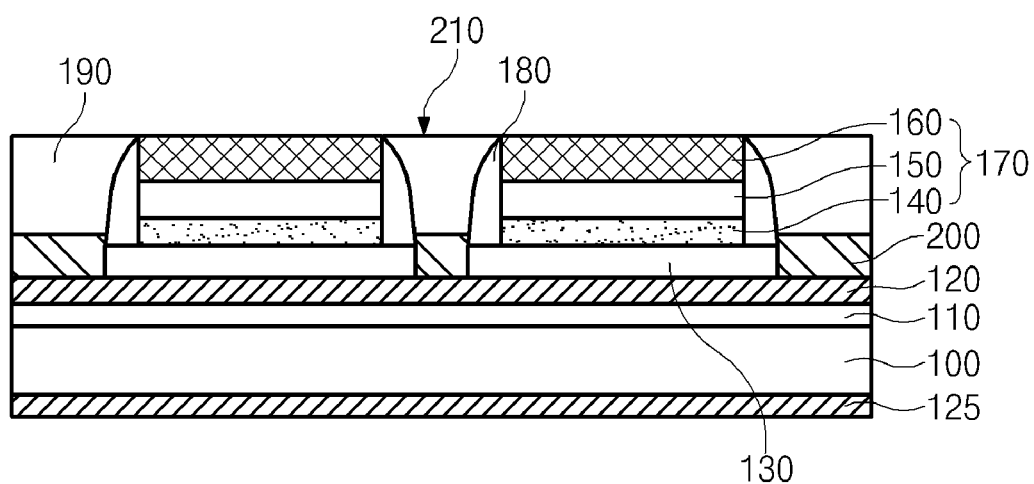

Referring to FIG. 1h, the metal layer 190 is etched through a CMP process or an etch back process to form a contact 210 on the compound layer 200.

As described above, upper and lower insulating layers are formed on an upper and bottom surfaces of a polymer substrate which forms a semiconductor substrate and a germanium layer is formed on the upper insulating layer to use a channel of a semiconductor device, thereby obtaining low power characteristic and improving the speed. It can prevent the leakage current of the semiconductor device due to the insulation characteristic of the polymer substrate and reduce the manufacturing cost of the semiconductor device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, comprising:
   forming an insulating layer over a polymer substrate;
   growing a germanium layer over the insulating layer;
   forming a gate pattern of a transistor over the germanium layer, the germanium layer defining a channel of the transistor;
   forming a metal layer over the gate pattern and the germanium layer, the metal layer contacting the germanium layer; and
   heating the metal layer to form a compound layer at an interface between the metal layer and the germanium layer.

2. The method of claim 1, wherein the germanium layer is grown to a thickness of 1 through 100 nm at a temperature of 200 through 600° C.

3. The method of claim 1, wherein the germanium layer is formed by a chemical vapor deposition or a low pressure chemical vapor deposition with a mixture of a first gas selected from the group consisting of B, P, As, $BF_3$, and a combination thereof and a second gas selected from the group consisting of $GeH_4$, $Ge_2H_6$, $Ge_3H_8$, and a combination thereof.

4. The method of claim 1, wherein the germanium layer is formed by implanting a gas selected from the group consisting of B, P, As, and $BF_3$ and performing a heat treatment at a temperature of 100° C. through 600° C.

5. The method of claim 1, wherein the forming a gate pattern comprises:
   forming an oxide layer, a gate electrode and a hard mask layer over the germanium layer; and
   etching the hard mask layer, the gate electrode and the oxide layer using a gate pattern mask.

6. The method of claim 5, further comprising forming spacers on side walls of the gate pattern.

7. The method of 5, wherein the oxide layer is a high dielectric oxide layer formed using one selected from the group consisting of Hf, Zr, Ta, Co and a combination thereof.

8. The method of claim 1,
   wherein the compound layer includes first material from the metal layer and second material from the germanium layer; and
   wherein the method further comprises removing the metal layer to form a contact.

9. The method of claim 8, wherein the metal layer is formed using one selected from the group consisting of Co, Ni, W and a combination thereof.

10. The method of claim 8, wherein the removing the metal layer includes performing a chemical mechanical polishing process or an etch back process.

11. The method of claim 1, the method further comprising:
 forming an adhesion layer over the polymer substrate, the adhesion layer being provided between the polymer substrate and the insulating layer.

12. The method of claim 1, wherein the insulating layer is formed over a first main surface of the polymer substrate, the method further comprising:
 forming another insulating layer on a second main surface of the polymer substrate, the first and second main surfaces being on opposing sides of the polymer substrate.

* * * * *